Feb. 23, 1971 J. A. F. OOMEN 3,566,288
VHF SOLID STATE AMPLIFIER
Filed Nov. 29, 1968
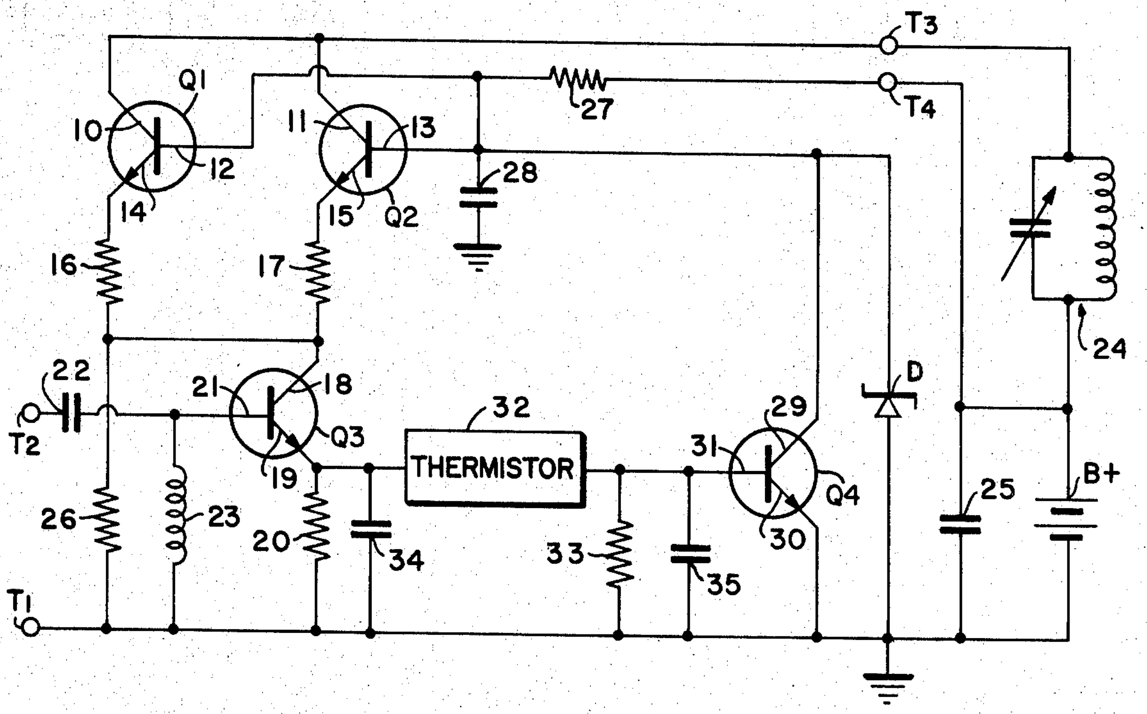
INVENTOR.
JOHANNES A. F. OOMEN
BY Charles M. Hogan
Irwin P. Garfinkle
ATTORNEYS.

United States Patent Office 3,566,288

Patented Feb. 23, 1971

3,566,288

VHF SOLID STATE AMPLIFIER

Johannes A. F. Oomen, Cincinnati, Ohio, assignor to Avco Corporation, Cincinnati, Ohio, a corporation of Delaware Filed Nov. 29, 1968, Ser. No. 780,106
Int. Cl. H03f 3/42, 3/02
U.S. Cl. 330—18 4 Claims

ABSTRACT OF THE DISCLOSURE

A solid state circuit, providing a direct replacement for a vacuum tube, is operable in the VHF region and achieves output power of approximately two watts with a collector supply voltage of 150 volts. A heatsink temperature sensor protects the device against high ambient temperatures without the need for thermal fuzes.

BACKGROUND OF THE INVENTION

At present there are no transistors capable of operation in the VHF region and of delivering up to several watts at a collector supply voltage of 150 volts. Operation at VHF has not been feasible at high collector voltages, and therefore present systems requiring such operation must use vacuum tubes. This invention overcomes the deficiencies of the prior art by providing solid state circuitry which provides satisfactory operation at VHF, and which can be plugged in to an existing vacuum tube socket to act as a direct replacement for a vacuum tube. In the embodiment disclosed the solid state circuitry replaces a pentode vacuum tube having four external connection points.

SUMMARY OF THE INVENTION

The inventive circuitry utilizes a plurality of transistors connected in parallel to extend the power capabilities of the device. Another transistor connects the emitters of the parallel-connected transistors to ground for the purpose of increasing the input resistance and increasing the gain. The voltage at the base of each of the parallel-connected resistors is regulated by means of a Zener diode. In addition, the regulated voltage on the transistor bases is controlled in response to temperature to protect the devices against high ambient temperatures and unfavorable loads without the need for thermal fuzes. The invention is characterized by a VHF transistor with low $V_{CEO}$ used as a common emitter current amplifier connected to high voltage switching transistors used as a common-base voltage amplifier.

THE DRAWING

A representative embodiment of the invention is shown in the single figure of the drawing.

DESCRIPTION OF THE INVENTION

Referring to the drawing, two switching transistors Q1 and Q2, each connected in a common-base configuration, are connected in parallel, the collector 10 of transistor Q1 being connected directly to collector 11 of transistor Q2, the base 12 of transistor Q1 being connected directly to the base 13 of transistor Q2 and the emitters 14 and 15 of transistors Q1 and Q2 being interconnected through resistors 16 and 17, respectively. While only two transistors are shown, it is understood that any number of transistors may be used in parallel to extend the power capabilities of the circuit.

The emitters 14 and 15 of transistors Q1 and Q2 are connected to ground through resistors 16 and 17, respectively, and through the collector 18 and emitter 19 of a transistor Q3, connected in a common-emitter configuration, and through the emitter resistor 20 of transistor Q3.

The collector 18 of transistor Q3 is connected to ground through a resistor 26. VHF input to the circuit is applied across terminals T1 and T2 to the base 21 of transistor Q3 through a coupling capacitor 22 and an R.F. choke 23. The collectors 10 and 11 of transistors Q1 and Q2 are connected to a terminal T3 which in turn is connected to a B+ supply through a tuned R.F. output circuit 24, the circuit 24 being grounded for radio frequencies through a capacitor 25.

A regulated voltage is applied to the bases 12 and 13 of transistors Q1 and Q2 by means of a Zener diode D supplied from the B+ supply through a terminal T4 and a resistor 27. A capacitor 28 provides an R.F. ground for the bases 12 and 13. Terminals T1, T2, T3, and T4 represent the normal tube socket connections for the cathode, control grid, anode, and screen, respectively, of a conventional pentode vacuum tube.

Overload protection for the circuitry is provided by means of a transistor Q4 having a collector 29 connected to the anode of diode D, a grounded emitter 30, and a base 31. The voltage developed across the emitter resistor 20 is applied across the base and emitter of transistor Q4 through a voltage divider network comprising a temperature sensitive resistor 32 and a fixed resistor 33. The capacitors 34 and 35 provide an R.F. by-pass.

Since the terminals T1, T2, T3, and T4 represent the existing tube socket connections of a conventional pentode for which the present transistorized circuit is designed as a replacement, the circuit may be mounted on a connector which is plugged in to the existing circuits. The tuned circuit 24 and the capacitor 25 represent existing circuitry external to the vacuum tube. If the circuit were to replace a triode, it would be necessary merely to connect the terminal T4 to the terminal T3.

OPERATION OF THE CIRCUITRY

VHF input is applied at terminals T1 and T2 to the base-emitter input circuit of the common-emitter transistor Q3. Transistor Q3 is a low collector voltage VHF transistor. The emitter resistor 20 serves the purpose of stabilizing the gain of transistor Q3 while the resistor 26 limits its cut-off resistance. The Zener diode D regulates the base voltage for transistors Q1 and Q2 while the resistors 16 and 17 divide the current applied to the transistors Q1 and Q2 equally. Diode D also provides the collector voltage for the transistor Q3 via the base emitter diode of transistors Q1 and Q2.

The voltage developed across the emitter resistor 20 of transistor Q3 is applied across the base emitter diode of transistor Q4 through the temperature sensitive resistor 32. If as a result of the voltage developed across its base-emitter diode, the transistor Q4 starts to conduct, the base voltage of transistors Q1 and Q2 will decrease and in turn the collector voltage of transistor Q3 will decrease. This results in a lowering of the collector current through transistor Q3 and through the parallel-connected transistors Q1 and Q2.

The temperature sensitive resistor 32 is mounted on the heatsink of the output transistors Q1 and Q2. When the heatsink temperature rises and as a result the output voltage of the divider network 32, 33 rises above the threshold to transistor Q4, it will start to conduct and the collector current of the power transistors Q1 and Q2 is lowered, causing the dissipation to be limited to a safe level. Thus, the power at ambient temperatures is not limited by the requirement for the device to be able to withstand high ambient temperatures. For powers of several watts the device must be fastened to a relatively large heatsink.

A practical embodiment of the invention has been reduced to practice delivering up to two watts in the 30–76 mHz. range. The parameters outlined in the embodiment as reduced to practice are as follows:

Transistors:
- Q1—Type 2N3742.
- Q2—Type 2N3742.
- Q3—Type 2N3866.
- Q4—Type 2N2222.

Resistors:
- 16—10 ohms.
- 17—10 ohms.
- 20—36 ohms.
- 26—10K ohms.
- 27—22K ohms.
- 32—Thermistor 10,000 ohms at 25° C.
- 33—820 ohms.

Capacitors:
- 22—10 pf.
- 25—1000 pf.
- 28—1000 pf.
- 34—1000 pf.
- 35—1000 pf.

Zener diode: D—Type 1N5240B.
R.F. choke: 23—18 microhenry.

SUMMARY

In summary, the invention achieves VHF power gain with a circuit that possesses properties found more common in a vacuum tube circuit. Contrary to known solid state circuits, the invention is characterized by the ability to operate from high collector voltages and an insensitivity for overload conditions. Those overload conditions may result from either an unfavorable loadline or high ambient temperatures. The ability to operate from a high collector supply voltage is achieved by using high voltage switching transistors Q1 and Q2. The VHF performance of such a transistor is improved by the grounded base configuration of these transistors.

While a single illustrative embodiment of this invention has been described, various modifications and adaptations will be apparent to persons skilled in the art. It is intended therefore that the invention be limited only by the following claims as interpreted in the light of the prior art.

I claim:

1. A solid state high frequency transistor amplifier, said solid state amplifier having four external connecting terminals, the combination comprising:
   - a direct current source;
   - a source of radio frequencies in said VHF region;
   - a first transistor having a base connected to one of said terminals, a collector, and an emitter connected to a point of reference potential through an emitter resistor, said source of radio frequencies being connected between said base and said point, said point being connected to a second of said terminals;
   - a second transistor having a base connected to a third of said terminals, an emitter, and a collector connected to a fourth of said terminals to provide an output, said base being connected to said point for said radio frequencies, said collector being connected to said direct current source through a radio frequency load, and said emitter being connected to said point through the collector and emitter of said first transistor and said emitter resistor;
   - a source of regulated direct voltage applied between the base of said second transistor and said point of reference potential, said source of regulated direct voltage comprising a resistor and a Zener diode connected between said direct current source and said point, said base of said second transistor being connected to the junction of said resistor and said diode; and
   - means for controlling said source of regulated direct voltage comprising a variable impedance device connected across said Zener diode, said variable impedance device having a high impedance at low temperatures, said impedance decreasing with increases in temperature.

2. The invention as defined in claim 1 wherein said variable impedance device is a third transistor having a base, a collector, and an emitter, said diode being connected between said collector and said emitter, the base and emitter of said transistor being supplied with voltage varying in response to temperature.

3. The invention as defined in claim 2 wherein said base and emitter are supplied with voltage through a voltage divider network comprising a fixed resistor and a variable resistor, said variable resistor being variable in response to temperature, said voltage divider being connected across the emitter resistor of said first transistor.

4. The invention as defined in claim 3, and at least one additional transistor connected in parallel with said second transistor to increase the power handling capabilities of said solid state amplifier.

References Cited

UNITED STATES PATENTS

| | | | |
|---|---|---|---|
| 3,274,505 | 9/1966 | Frisch et al. | 330—18 |
| 3,287,653 | 11/1966 | Goordman | 330—18 |
| 3,447,091 | 5/1969 | Bennett | 330—18 |

OTHER REFERENCES

RC Technical Notes, RCATN No.: 637, August 1965, "Improved High Voltage-High Frequency Amplifier," by William J. Hannah.

NATHAN KAUFMAN, Primary Examiner

U.S. Cl. X.R.

330—21, 24